(12) United States Patent
Reznikov (10) Patent No.: US 7,106,596 B1
(45) Date of Patent: Sep. 12, 2006

(54) COMPONENT REMOVAL APPARATUS

(75) Inventor: Naum Reznikov, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 43 days.

(21) Appl. No.: 10/898,623

(22) Filed: Jul. 23, 2004

(51) Int. Cl.
 *H05K 5/00* (2006.01)
 *G06F 1/16* (2006.01)

(52) U.S. Cl. .................. 361/724; 361/685; 312/223.1

(58) Field of Classification Search ........ 361/724–727, 361/685; 312/223.1, 223.2
See application file for complete search history.

(56) References Cited

U.S. PATENT DOCUMENTS

| | | | |
|---|---|---|---|
| 4,693,503 A | 9/1987 | Bisbing | |
| 5,226,828 A | 7/1993 | Fietz | |
| 5,255,154 A | 10/1993 | Hosoi et al. | |
| 5,269,698 A | 12/1993 | Singer | |
| 5,359,492 A * | 10/1994 | Porter | 361/683 |
| 5,417,012 A | 5/1995 | Brightman et al. | |
| 5,504,648 A | 4/1996 | Honda et al. | |
| 5,755,350 A | 5/1998 | Marthaler | |
| 5,790,373 A * | 8/1998 | Kim et al. | 361/685 |
| 5,868,261 A | 2/1999 | Collins et al. | |
| 5,946,186 A | 8/1999 | Karl et al. | |
| 6,134,115 A * | 10/2000 | Sim et al. | 361/747 |
| 6,137,684 A * | 10/2000 | Ayd et al. | 361/727 |
| 6,169,653 B1 | 1/2001 | Engel | |
| 6,178,086 B1 * | 1/2001 | Sim et al. | 361/683 |
| 6,222,736 B1 * | 4/2001 | Sim et al. | 361/727 |
| 6,246,576 B1 | 6/2001 | Sands et al. | |
| 6,272,005 B1 * | 8/2001 | Jensen et al. | 361/680 |
| 6,273,532 B1 | 8/2001 | Chen et al. | |
| 6,288,902 B1 | 9/2001 | Kim et al. | |
| 6,374,460 B1 * | 4/2002 | Edevold et al. | 361/725 |
| 6,625,014 B1 * | 9/2003 | Tucker et al. | 361/685 |
| 6,637,847 B1 | 10/2003 | Crisp et al. | |
| 6,641,182 B1 | 11/2003 | Schlack et al. | |
| 6,768,643 B1 | 7/2004 | Rust et al. | |
| 6,816,367 B1 * | 11/2004 | Liu et al. | 361/685 |
| 2003/0112596 A1* | 6/2003 | Shih | 361/685 |

* cited by examiner

*Primary Examiner*—Lisa Lea-Edmonds
(74) *Attorney, Agent, or Firm*—Meyertons Hood Kivlin Kowert & Goetzel, P.C.; B. Noël Kivlin; Chris D. Thompson (57) ABSTRACT

An apparatus for controlling removal of a component from a chassis may include an engaging member and a control member. The engaging member may engage a portion of the chassis when the component is withdrawn to a predetermined position in the chassis to inhibit removal of the component from the chassis. The control member may be operated to disengage the component from the chassis such that the user can remove the component from the chassis. The control member may be a handle that disengages the engaging member from the chassis when the handle is deployed.

24 Claims, 9 Drawing Sheets

COMPONENT REMOVAL APPARATUS

BACKGROUND OF THE INVENTION

1. Field of the Invention

This invention relates generally electronic equipment, such as computers, and, more particularly, to apparatus used during removal of electronic equipment from computer systems.

2. Background Information

Electronic systems such as computers are typically constructed in a modular fashion. Several components of a system may be housed in a chassis. For example, a chassis may contain a power supply, several printed circuit card assemblies, disk drives, and other components. Components may be installed in a chassis on slides, rails, or similar structures. Some components may slide in and out of the chassis for servicing.

In some systems, components in a chassis may be heavy and large. For example, a power supply for a computer system may weigh about 35 pounds and be about 20 inches long. In some cases, a rate of removal of a heavy component may be difficult to control. If a component is dropped as it removed from the chassis, injury to personnel or damage to the component or other equipment may result.

Some mechanisms are known for use in removing a component from a system. For example, in certain systems, a user must release a stop mechanism before a component can be removed. In some cases, a user may not be supporting the component when the stop mechanism is operated. Such mechanisms may require several dedicated parts that serve no other function in the system.

It would be beneficial to have an apparatus for controlling removal of a component from a chassis that promotes release of the mechanism while a user is supporting the component. In would further be beneficial to provide an apparatus for controlling removal of a component from a chassis using elements that serve other functions in a system.

SUMMARY OF THE INVENTION

In an embodiment, a computer system may include an apparatus for controlling removal of a component from a chassis. The apparatus may include an engaging member mounted on an enclosure of the component. The engaging member may engage a portion of a chassis when the component is withdrawn to a predetermined position in the chassis. The engaging member may inhibit removal of the component from the chassis until the engaging member is disengaged. The apparatus may include a control member that allows a user to disengage the engaging member from the chassis. In some embodiments, the control member may be a handle that disengages the engaging member from the chassis when the handle is deployed or used.

In an embodiment, a computer system may include removal apparatus on opposing sides (e.g., left and right sides) of a component. Each removal apparatus may include an engaging member that engages the chassis when the component is withdrawn to a predetermined position in the chassis. Each removal apparatus may further include a carrying handle. The carrying handle may disengage an engaging member from the chassis when the carrying handle is lifted. In one embodiment, a user may grasp and lift both carrying handles to disengage the engaging members from the chassis. With the engaging members disengaged, the user may proceed to remove the component from the chassis using the carrying handles.

In an embodiment, an engaging member of a removal apparatus may be a spring. A portion of the spring may resiliently engage in an opening on a chassis when the spring is aligned with the opening. A control member of the apparatus may be operable to deflect a portion of the spring such that the spring is retracted from the opening. In one embodiment, the control member may be a handle rotatably coupled to the enclosure. The handle may retract the spring from the opening when a grip portion of the handle is rotated away from the component.

In an embodiment, a component may include a stop for a handle. The stop may inhibit rotation of the handle by more than a predetermined amount. In one embodiment, a stop may limit rotation of a handle to less than a 90° relative to a side of an enclosure for the component.

In an embodiment, a control member for a removal apparatus may be located proximate to a carrying handle. The control member may be operable with a finger or thumb of a hand while the hand is grasping the carrying handle.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

A computer system may include components installed in a chassis. As used herein, "chassis" includes any structure that supports or houses one or more elements of a computer system (e.g., electronic modules). As used herein, "component" includes any separable part of a system, including, but not limited to, a power supply, a disk drive, or a printed circuit board. A component may be supported in a chassis by various structures including, but not limited to, slides, rails, a shelf, or a bottom wall of a chassis.

Figure 1:
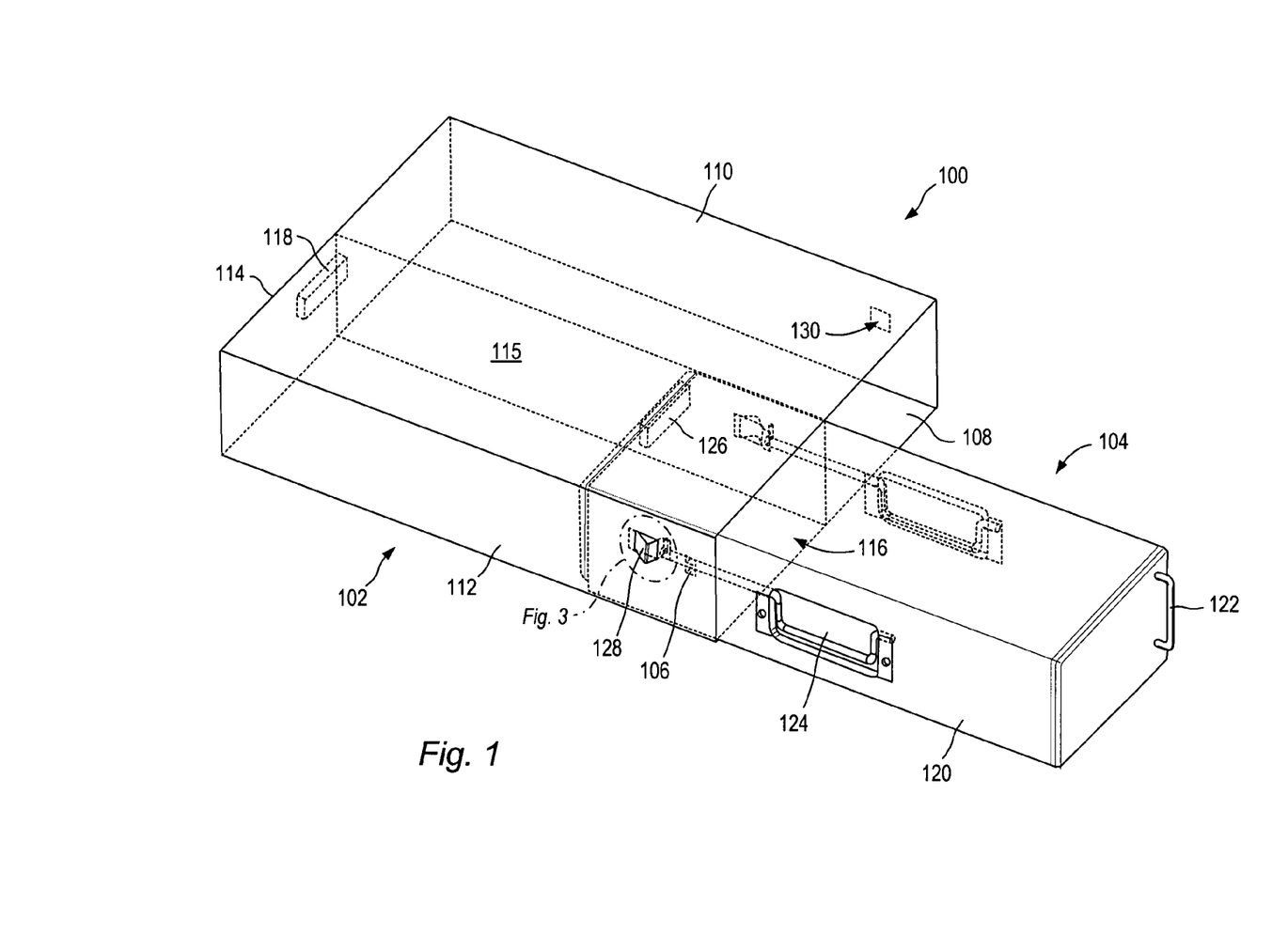
FIG. 1 depicts a component including left and right removal apparatus engaged in a chassis.

FIG. 1 depicts computer system 100 including chassis 102 and component 104. Chassis 102 may include bottom panel 108, top panel 110, side panels 112, rear panel 114, and center panel 115. Rear panel 114 may include connector part 118. Component 104 may be supported on bottom panel 108 of chassis 102. Component 104 may be removable from chassis 102 through access opening 116.

Figure 2:
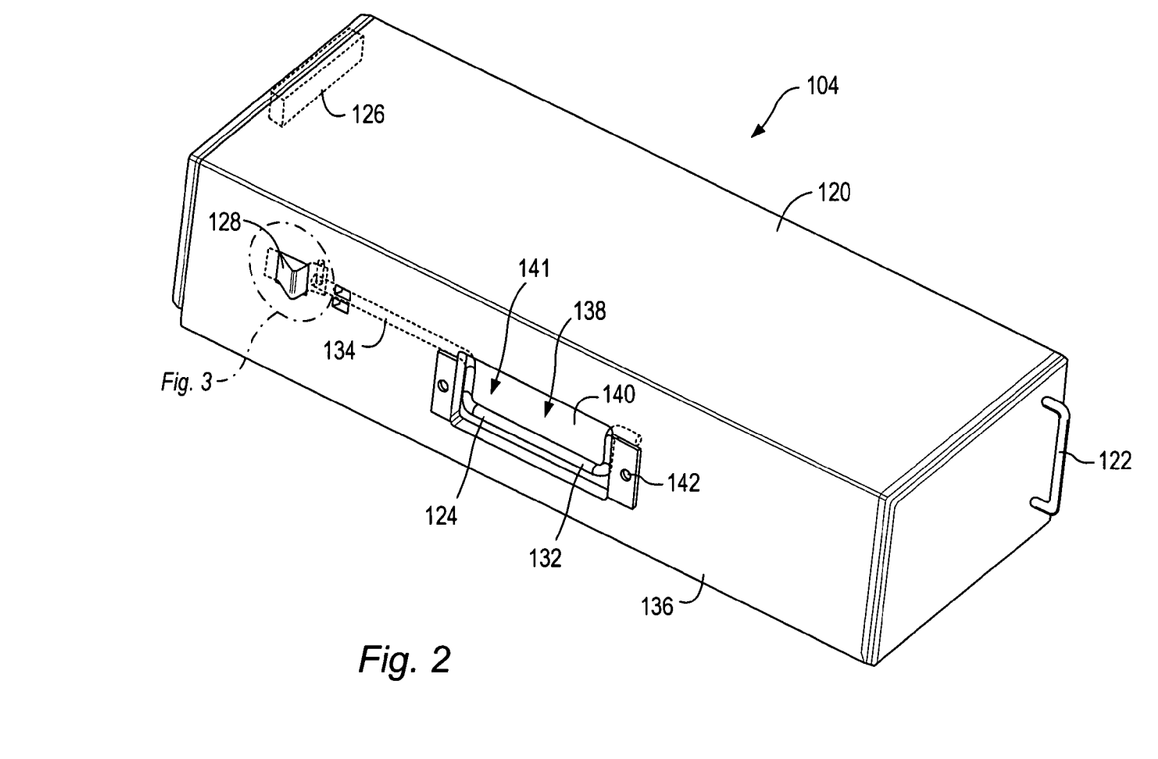
FIG. 2 depicts a component including left and right removal apparatus.

FIG. 2 depicts an isometric view of component 104. Component 104 may include enclosure 120, front handle 122, and handles 124 on left and right sides of component 104. Connector part 126 may be provided on a rear side of component 104. Connector part 126 of component 104 may couple with connector part 118 on chassis 102 (shown in FIG. 1) when the component is installed in the chassis.

A component may include an apparatus for controlling speed of removal of the component from a chassis. In some embodiments, the apparatus may operate when the component is partially withdrawn from a chassis to inhibit removal of the component until a user performs an operation to release the apparatus. An apparatus may include an engaging member that couples with a portion of a chassis. As used herein, "engage" or "engaging" includes any condition in which one element engages (e.g., contacts) another element during operation or use of an apparatus. Examples of an engaging member include, but are not limited to, a spring, a pin, a hook, a barb, a tab, or a projection. In some embodiments, an engaging member may be a single member. In other embodiments, an engaging member may include multiple members. Portions of an engaging member may be straight and/or curved, flexible and/or rigid, or a combination thereof. In some embodiments, an engaging member may be produced from a resilient material (e.g., thin metal plate or elastomer).

As shown in FIG. 2, removal apparatus 106 may include flat spring 128. Flat spring 128 may engage holes 130 (shown in FIG. 1) in side panel 112 and center panel 115 of chassis 102. Holes for an engaging member may be of various shapes, including, but not limited to, round, square, rectangular, or diamond-shaped. In certain embodiments, holes may be provided at additional locations (e.g., farther from the front of the chassis) to inhibit movement at desired points of withdrawal of a component from a chassis. In certain embodiments, engaging members on a component may engage projections (e.g., hooks, tabs, or pins) on a chassis.

A removal apparatus may include a control member. As used herein, "control member" includes any member that is operable by a user to affect position or orientation of another element (e.g., an engaging member). Examples of a control member include, but are not limited to, a handle, a knob, a lever, a slide, a button, or a switch. A control member may include a portion to interconnect a manipulable part of the control member (e.g., a knob) with an engaging member. Examples of interconnecting portions include, but are not limited to, a rod, a shaft, a bar, or a beam, or a combination thereof. Portions of a control member may be straight and/or curved, flexible and/or rigid, or a combination thereof. In some embodiments, a control member may be a single member (e.g., a single rod). In other embodiments, a control member may include multiple members (e.g., a linkage of two or more rods, or a shaft coupled to a knob). In certain embodiments, a control member and an engaging member may be produced as a unitary structural element.

In one embodiment, as shown in FIG. 2, control member may be handle 124. Handle 124 may include grip portion 132 and shaft portion 134. In one embodiment, handle 124 is produced from a steel rod. Handle 124 may be produced from various other materials, such as aluminum, titanium, or polymers (e.g., polyvinyl chloride, ABS). Handle 124 may be pivotally coupled to side walls 136 of enclosure 120 in apertures 138. Component 104 may include inserts 140 in apertures 138. Inserts 140 may be attached to enclosure 120 using screws 142 or other fasteners. Recesses 141 may accommodate handles 124. Inserts 140 may retain handles 124 on side walls 136.

Figure 3:
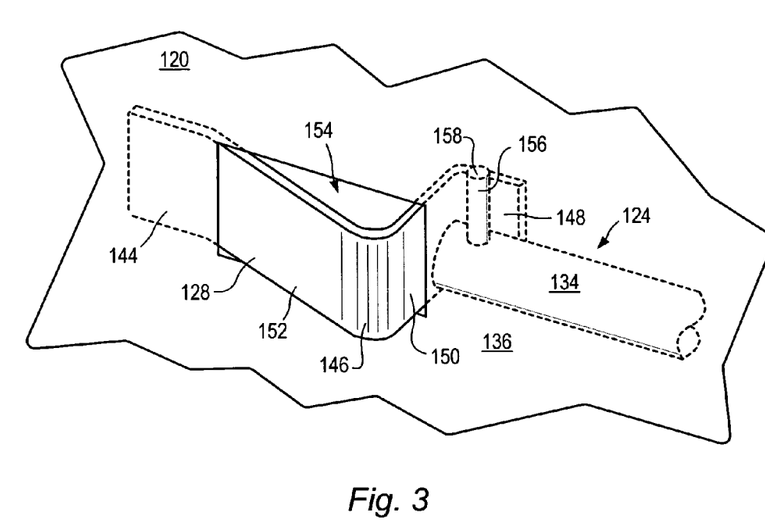
FIG. 3 depicts a detail view of a flat spring for a removal apparatus projecting from an enclosure of a component.

FIG. 3 depicts a detail view of a flat spring 128 attached to enclosure 120. Flat spring 128 may include fixed end 144, projecting portion 146, and free end 148. Projecting portion 146 may include front section 150 and rear section 152. In some embodiments, flat spring 128 may be produced from spring steel. Fixed end 144 of flat spring 128 may be attached to enclosure 120. Projecting portion 146 of flat spring 128 may project through opening 154 in side wall 136 of enclosure 120.

Handle 124 may include pin 156. Pin 156 may extend transversely from shaft portion 134 of handle 124. Tip 158 of pin 156 may contact free end 148 of flat spring 128 when handle 124 is rotated. Pin 156 may displace free end 148 away from side wall 136. Displacement of free end 148 may at least partially retract projecting portion 146 of flat spring 128 into enclosure 120. Other examples of portions of a control member that can be used to deflect an engaging member include, but are not limited to, projections, cams, grooves, or dimples.

Figure 4:
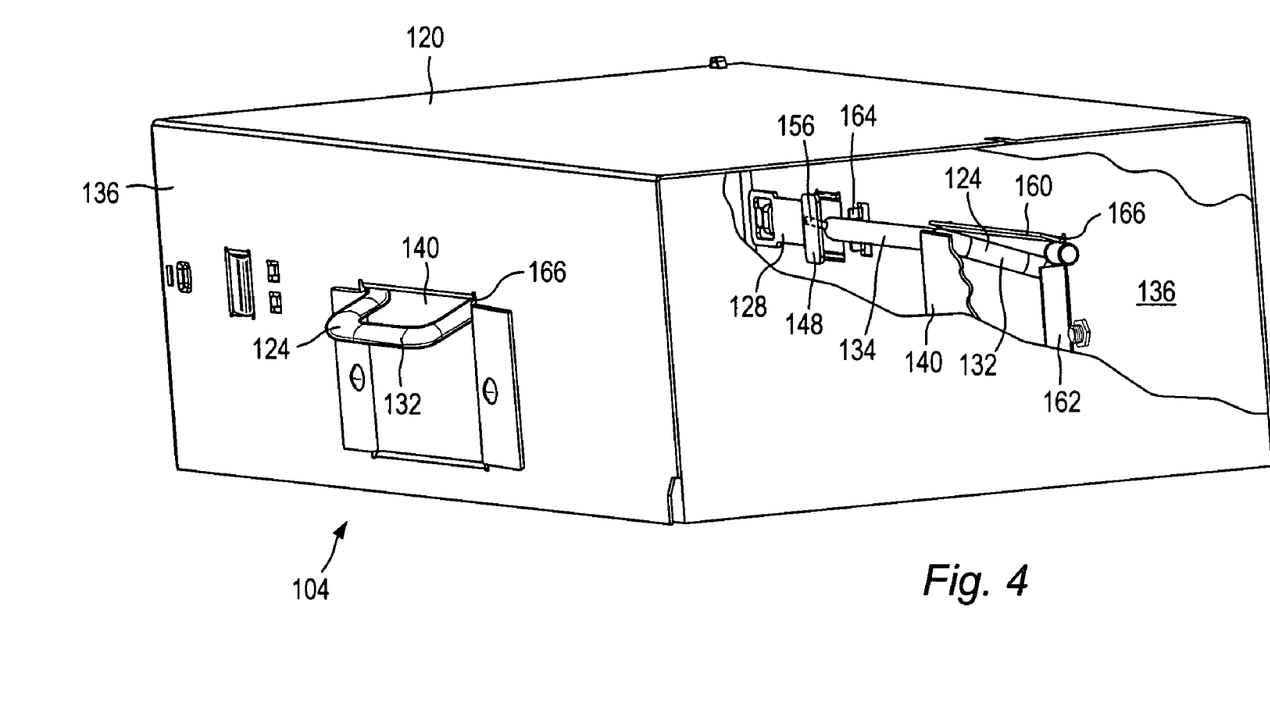
FIG. 4 depicts a cutaway view of a removal apparatus on a component.

FIG. 4 depicts a cutaway view of a removal apparatus 106 in component 104. Handle 124 may be retained by insert 140 between upper flange 160 and side flanges 162. Support prongs 164 on enclosure 120 may hold shaft portion 134 of handle 124. Shaft portion 134 of handle 124 may rotate when grip portion 132 of handle 124 is lifted upward by a user. As shaft portion 134 of handle 124 rotates, pin 156 may displace free end 148 of flat spring 128 away from side wall 136. Stop 166 may be provided on enclosure 120. Stop 166 may inhibit handle 124 from rotating beyond a predetermined amount. In one embodiment, stop 166 may inhibit handle 124 from rotating more than about 70° away from side wall 136.

Figure 5:
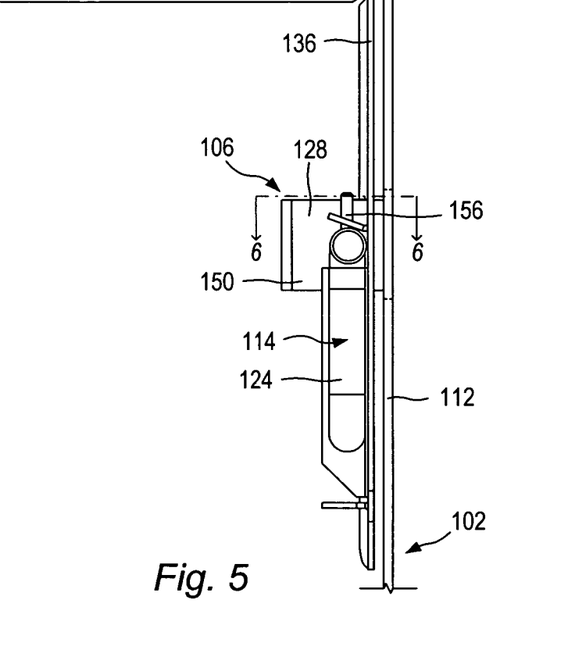
FIG. 5 depicts an end view of a component partially installed in a chassis.
Figure 6:
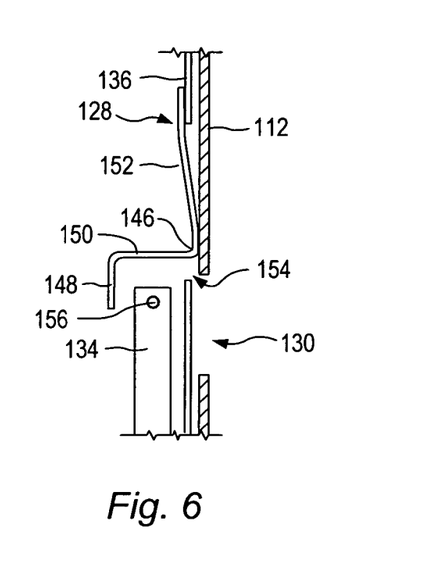
FIG. 6 depicts a top view of a flat spring on a component partially installed in a chassis.

FIGS. 5–10 depict views of removal apparatus 106 as component 104 is installed and removed from chassis 102. As shown in FIG. 1, removal apparatus 106 may be provided on opposing sides (e.g., left and right sides) of a component. FIG. 5 depicts an end view of component 104 partially installed in chassis 102. FIG. 6 depicts a top view of flat spring 128 when component 104 is partially installed in chassis 102. Flat spring 128 may be deflected by side panel 112 (or center panel 115, as applicable) when component 104 is slid into or out of chassis 102. During insertion of component 104, projecting portion 146 of spring 128 may snap into hole 130 under the spring force of flat spring 128. As a user continues insertion of component 104, projecting portion 146 may deflect out of hole 130 from contact with side panel 112. Taper of rear section 152 of projecting portion 146 may facilitate smooth deflection of flat spring 128 by side panel 112. Handle 124 may remain in an undeployed position (e.g., closed, folded, retracted, or stowed) during installation of component 104 into chassis 102. As shown in FIG. 5, in some embodiments, handle 124 may be stowed in recess 141 when handle 124 is in an undeployed position. In other embodiments, all or part of handle 124 may protrude from the walls of enclosure 120 when handle 124 is in an undeployed position. When component 104 is fully installed, handle 124 may be inaccessible to a user (e.g., several inches inside the chassis).

Figure 7:
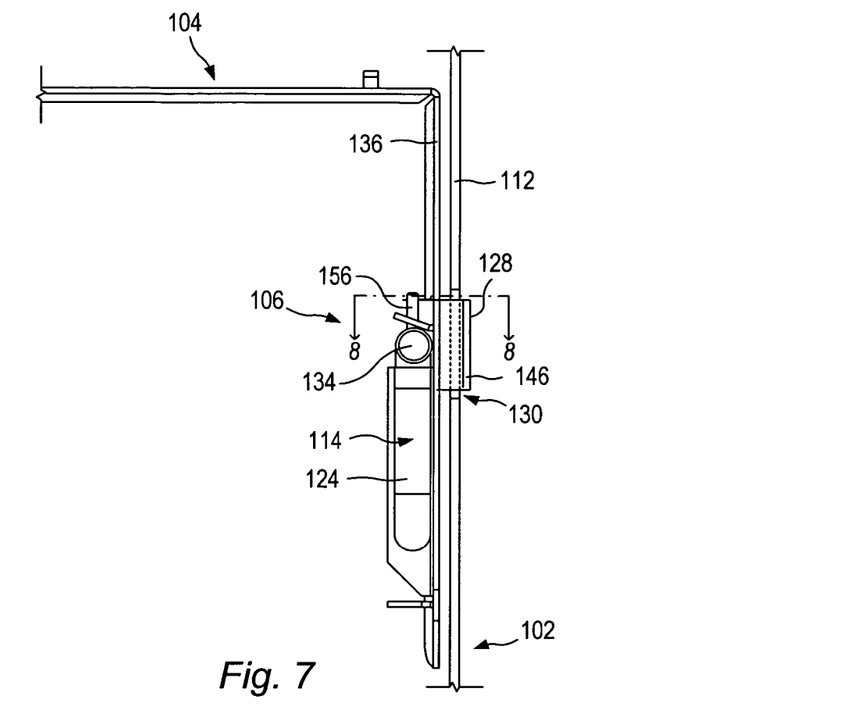
FIG. 7 depicts an end view of a removal apparatus with a flat spring engaged in a chassis.
Figure 8:
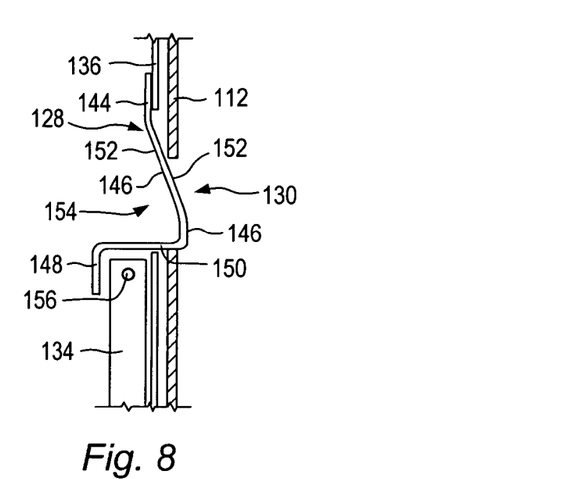
FIG. 8 depicts a top view of a flat spring of a removal apparatus engaged in a chassis.

FIG. 7 depicts an end view of removal apparatus 106 when flat spring 128 is engaged in hole 130 of chassis 102. FIG. 8 depicts a top view of flat spring 128 when flat spring is engaged in hole 130. A user may withdraw component 104 from a fully installed position in chassis 102 using front handle 122 (shown in FIG. 2). Handle 124 may be in an undeployed position as component 104 is initially withdrawn. Flat spring 128 may snap into hole 130 under the spring force of flat spring 128 as projecting portion 146 aligns with hole 130. Front section 150 of projecting portion 146 may engage a side of hole 130. Engagement of flat spring 128 in hole 130 may inhibit further withdrawal of component 104. As shown in FIG. 1, most of the component may be extending out of the front of chassis 102 when flat spring 128 engages in hole 130. Handle 124 may be accessible to a user. In certain embodiments, holes in a chassis may be located such that most of the component is still in a chassis when the removal apparatus engages the chassis.

Figure 9:
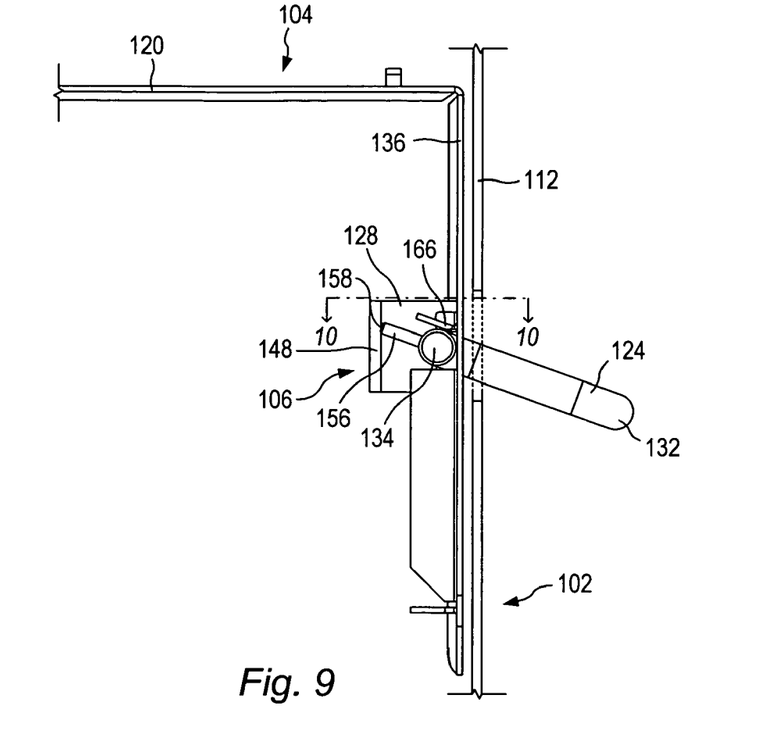
FIG. 9 depicts an end view of a removal apparatus with a handle deployed to disengage a flat spring.
Figure 10:
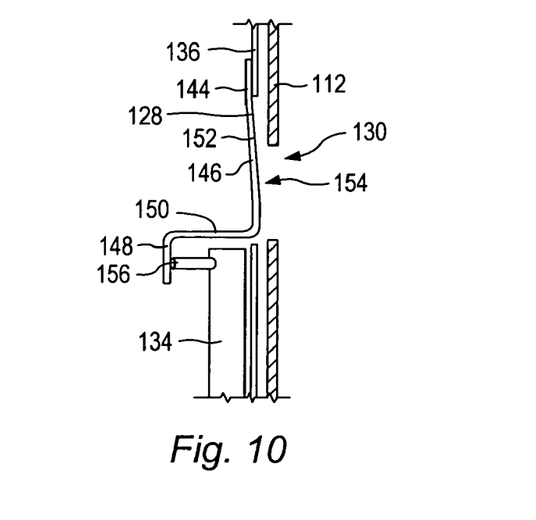
FIG. 10 depicts a top view of a flat spring disengaged from a chassis.

FIG. 9 depicts an end view of removal apparatus 106 when handle 124 is in a deployed position (e.g., a carrying position). FIG. 10 depicts a top view of a flat spring 128 when handle 124 is in a deployed position. A user may grasp grip portion 132 of handle 124 and rotate handle 124 away from side wall 136 of enclosure 120. Handle 124 may be rotated until handle 124 reaches stop 166 (as shown in FIG. 9). As handle 124 is rotated, pin 156 may rotate about shaft portion 134 such that tip 158 of pin 156 engages free end 148 of flat spring 128. Free end 148 may be displaced such that projecting portion 146 of flat spring 128 is deflected out of hole 130 (as shown in FIG. 10). When flat springs 128 on both sides of component 104 are disengaged, the user may recommence withdrawal of component 104 from chassis 102. Withdrawal may be continued until the component clears the chassis.

A removal apparatus that operates when one or more carrying handles are deployed or used may help ensure that a user has a firm hold of a component when the component clears a chassis. In some embodiments, handles on opposing sides of a component may each actuate a separate removal apparatus (e.g., as shown in FIG. 1). If a user is grasping carrying handles when engaging members of a removal apparatus are disengaged from a chassis, a risk of accidental dropping of the component may be reduced. Providing a carrying handle that also serves as a control member for a removal apparatus may reduce a number of components in a system.

In some embodiments, handles may be placed at or near a center of gravity of a component such that the component is balanced when the component is removed. Handles near a center of gravity may reduce shifting of a component (e.g., a rear portion of heavy power supply dropping rapidly) when the component clears a chassis.

Figure 11:
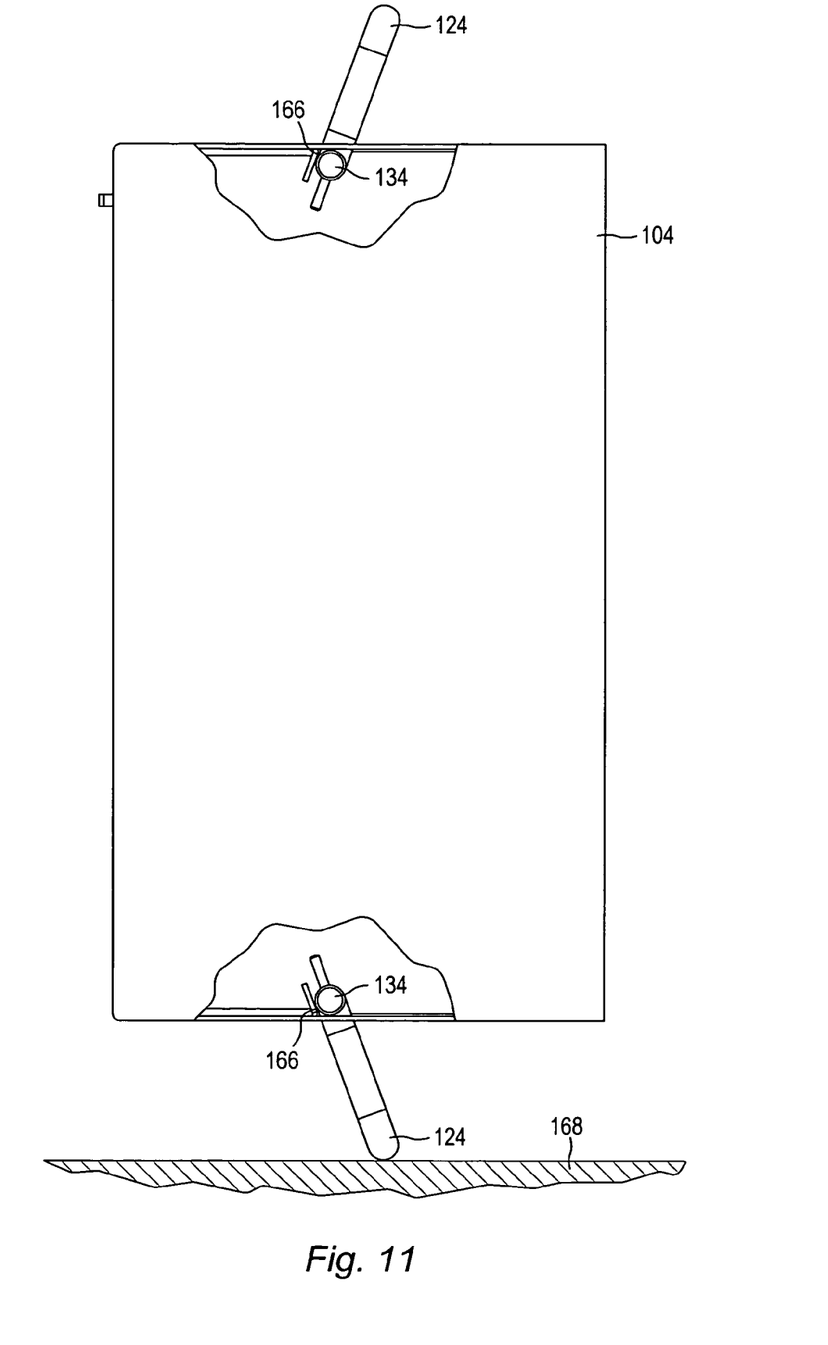
FIG. 11 depicts placement of a component having opposing handles on a flat surface.

A stop on a handle may facilitate handling of a component after it is removed from a chassis. FIG. 11 depicts component 104 being installed on a horizontal surface 168 (e.g., a table or floor). Stop 166 may keep handle 124 at an acute angle with respect to side wall 136 of enclosure 120. Contact between handle 124 and horizontal surface 168 may cause handle 124 to fold down into recess 141. Folding of handle 124 may allow component 104 to rest flat on horizontal surface 168.

In some embodiments, a control member of a removal apparatus may be separate from a carrying handle of a component. In certain embodiments, a control member (e.g., a button or a lever) may be located within reach of a user's hand when the user is grasping a carrying handle. For example, a finger tab for a removal apparatus may be located such that the user can operate the finger tab with one finger while gripping the handle with the other fingers of the hand. Placement of a control member near a carrying handle may promote grasping of the carrying handle when the removal apparatus is operated.

Figure 12:
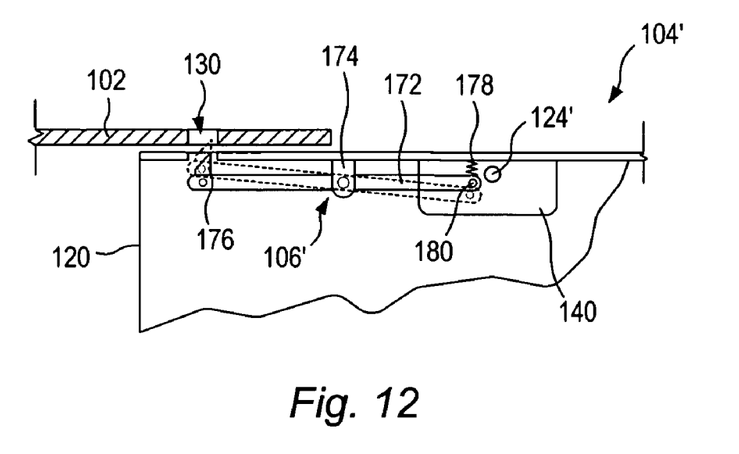
FIGS. 12 and 13 depict an embodiment of removal apparatus having a top handle and a retractable pin.
Figure 13:
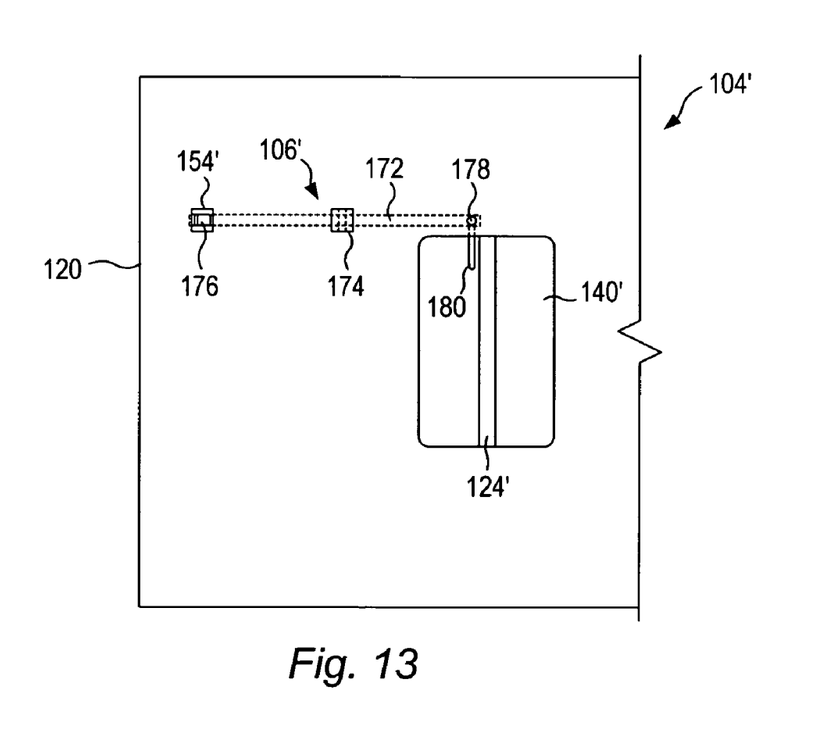

FIGS. 12 and 13 depict an embodiment of removal apparatus 106' including handle 124' on a top surface on enclosure 120. Handle 124' may be coupled to enclosure 120' on insert 140'. Lever 172 may be pivotally coupled to enclosure 120 at clevis 174. Latch pin 176 may be pivotally coupled to lever 172. Latch pin 176 may slide in opening 154' with enclosure 120. Compression spring 178 may bias lever 172 such that latch pin 176 protrudes out of enclosure 120. Latch pin 176 may engage in hole 130 in chassis 102 when component 104' is withdrawn from a fully installed position in chassis 102. To release latch pin 176, a user may lift finger hook 180 while grasping handle 124'. Lifting finger hook 180 may retract latch pin 176 from hole 130 in chassis 102, allowing removal of component 104' from chassis 102. In some embodiments, a second carrying handle may be provided near a front end of component 104'.

In certain embodiments, a single control member may be used to operate two or more engaging members. For example, a handle on a top surface of an enclosure may be coupled to retractable engaging members on the left and right sides of the enclosure. As the handle is lifted, the engaging members may be retracted from holes in a chassis, thus allowing the component to be removed from the chassis.

In the context of this patent, the term "coupled" includes direct coupling or indirect coupling (e.g., with one or more intervening elements). For example, an engaging member and a control member may be coupled by directly attaching the engaging member to the control member or by attaching each of the engaging member and the control member to one or more intervening elements (e.g., to a housing for a component).

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims. For example, when the terms "vertical," "horizontal" "upward", "downward," "under", "over," "left," or "right" are used in the claims, they are to be understood to relate to the Figures as illustrated. However, the device may be turned at an angle to the horizontal or inverted with the quoted terms referring to the altered orientation.

What is claimed is:

1. An apparatus for controlling removal of a component from a chassis, comprising:

an engaging member configured to couple with the component, the engaging member being configurable to resiliently engage a portion of the chassis when the component is partially removed from the chassis to inhibit further removal of the component from the chassis; and a control member configured to couple with the engaging member; the control member being operable to disengage the engaging member from the portion of the chassis to allow removal of the component from the chassis.

2. The apparatus of claim 1, wherein the control member comprises a handle.

3. The apparatus of claim 1, wherein the control member comprises a handle, wherein the engaging member is configurable to engage the portion of the chassis when the handle is undeployed, wherein the handle is configurable to disengage the engaging member from the portion of the chassis when the handle is deployed.

4. The apparatus of claim 1, wherein the control member comprises a handle, wherein the engaging member is configurable to engage the portion of the chassis when the handle is in a non-carrying position, wherein the handle is configurable to disengage the engaging member from the portion of the chassis when the handle is moved to a carrying position.

5. The apparatus of claim 1, wherein the control member comprises a handle, wherein the handle is configurable to disengage the engaging member from the portion of the chassis when the handle is rotated away from the component.

6. The apparatus of claim 1, wherein the engaging member comprises a resilient member.

7. The apparatus of claim 1, wherein the engaging member comprises a flat spring.

8. The apparatus of claim 1, wherein the control member comprises a handle portion and a shaft portion, wherein the handle portion and the shaft portion are formed from a metal rod.

9. The apparatus of claim 1, wherein the control member comprises a shaft portion, wherein the control member is configurable to disengage the engaging member from the portion of the chassis when the shaft portion is rotated.

10. The apparatus of claim 1, wherein the control member comprises a deflecting portion, wherein the deflecting portion is configured to deflect a portion of the engaging member when a portion of the control member is rotated.

11. The apparatus of claim 1, wherein the engaging member comprises a resilient member, wherein the resilient member is configured to urge a projecting portion of the engaging member into an opening in the chassis when the projecting portion is aligned with the opening, wherein the control member is operable to at least partially retract the projecting portion from the opening.

12. A component, comprising:
  an enclosure configured for installation in a chassis, the enclosure comprising first and second sides;
  an first engaging member coupled to the enclosure, the first engaging member being configured to engage a portion of the chassis when the component is in a predetermined position in the chassis to inhibit removal of the component from the chassis; and
  a first control member configured to couple to the first engaging member, the first control member being operable to disengage the first engaging member from the portion of the chassis to allow removal of the component from the chassis;
  a second engaging member; and
  a second control member,
  wherein the first engaging member and the first control member are coupled to the first side of the enclosure, wherein the second engaging member and the second control member are coupled to the second side of the enclosure.

13. The component of claim 12, wherein the first control member comprises a handle, wherein the first engaging member is configured to engage the portion of the chassis when the handle is in a non-carrying position, wherein the handle is configured to disengage the first engaging member from the portion of the chassis when the handle is moved to a carrying position.

14. The component of claim 12, wherein the first control member comprises a handle, wherein the handle is configured to disengage the first engaging member when a grip portion of the handle is rotated away from a side of the enclosure.

15. The component of claim 12, wherein the first control member comprises a handle, wherein the enclosure comprises a recess, and wherein the handle is configured to substantially reside in the recess when the handle is not deployed.

16. The component of claim 12, wherein the first control member comprises a handle, wherein the enclosure comprises a stop, wherein the stop is configured to inhibit the handle from rotating by more than a predetermined amount.

17. The component of claim 12, wherein the first control member comprises a handle coupled to a side of the enclosure, wherein the enclosure comprises a stop, wherein the stop limits an angle between the handle and the side of the enclosure to less than 90°.

18. The component of claim 12, wherein the first engaging member comprises a resilient member, wherein the resilient member is configured to urge a projecting portion of the first engaging member into an opening in the chassis when the projecting portion is aligned with the opening, wherein the first control member is operable to at least partially retract the projecting portion from the opening.

19. The component of claim 12, further comprising a handle configured to couple with the component.

20. The component of claim 12, further comprising a handle configured to couple with the component, wherein the first control member is operable by a finger or thumb of a user when the hand is grasping the handle.

21. A method of removing a component from a chassis, comprising:
  withdrawing the component from the chassis until an engaging member on the chassis engages a portion of the chassis to inhibit further withdrawal of the component;
  grasping at least one handle on the component;
  moving the handle from a first position to a second position; wherein moving the handle from the first position to the second position disengages the engaging member from the portion of the chassis; and
  withdrawing the component until the component is removed from the chassis.

22. The method of claim 21, wherein moving the handle from a first position to a second position comprises rotating the handle away from a side of the component.

23. The method of claim 21, wherein grasping at least one handle on the component comprises grasping a handle on one side of the component and grasping another handle on an opposing side of the component.

24. The method of claim 21, wherein moving the handle from a first position to a second position comprises rotating the handle away from a side of the component.

* * * * *